United States Patent [19]

Shirato

[11] 4,054,865

[45] Oct. 18, 1977

[54] SENSE LATCH CIRCUIT FOR A BISECTIONAL MEMORY ARRAY

[75] Inventor: Hajime Shirato, Tokyo, Japan

[73] Assignee: Nippon Electric Co., Ltd., Tokyo, Japan

[21] Appl. No.: 680,700

[22] Filed: Apr. 27, 1976

[30] Foreign Application Priority Data

Apr. 30, 1975 Japan .................................. 50-52694

[51] Int. Cl.² .......................... G11C 5/02; G11C 7/06
[52] U.S. Cl. ................................ 340/173 R; 307/238;
340/173 FF
[58] Field of Search ..... 340/173 R, 173 FF, 173 CA;
307/238

[56] References Cited

U.S. PATENT DOCUMENTS

| 3,714,638 | 1/1973 | Dingwall et al. | 340/173 CA |
| 3,838,295 | 9/1974 | Lindell | 340/173 CA |
| 4,003,035 | 1/1977 | Hoffman et al. | 340/173 FF |
| 4,004,285 | 1/1977 | Bormann et al. | 340/173 CA |

Primary Examiner—Stuart N. Hecker
Assistant Examiner—Donald McElheny
Attorney, Agent, or Firm—Hopgood, Calimafde, Kalil, Blaustein & Lieberman

[57] ABSTRACT

A memory circuit includes a plurality of memory cells arranged in an array of intersecting rows and columns and a plurality of differential amplifiers corresponding to the number of columns in the array. The memory array is divided into first and second row groups. Each of the differential amplifiers has one input connected to the memory cells in one of the row groups in one of the columns, and a second input connected to the memory cells in the second row group and to the same column connected to the first input. An output sense amplifier has one input selectively connected to the first input of a selected differential amplifier, and a second input selectively connected to a second input of the selected differential amplifier.

8 Claims, 8 Drawing Figures

SENSE LATCH CIRCUIT FOR A BISECTIONAL MEMORY ARRAY

The present invention relates to memory circuits using insulated-gate field-effect transistors, and more particularly to memory circuits consisting of one-transistor-per-bit memory cells.

In a memory circuit employing one transistor and one capacitor as a memory cell, the read out signal is so weak that a highly efficient sense amplifier is necessary. In conventional one-transistor-per-bit memory circuits, the memory output signal is supplied through two stages of differential amplifiers to an external output circuit. Each of the first stage amplifiers, connected to each of the columns of the memory cell matrix array, amplifies the information signal read out of the selected one of the memory cells belonging to the column and supplies it to the input/output (I/O) bus. The signal then goes to one input of the second stage differential amplifier, i.e. the output sense amplifier, the other input of which is supplied with a reference voltage; the two inputs are differentially amplified and supplied to the output circuit. There have been difficulties in the operation of the prior art memory circuits in determining the reference voltage to be applied to the other input of the sense amplifier for reasons that are described later in this specification. Furthermore, the selection of the timing for activating the sense amplifier is limited. In addition, a certain period of time is required before the output sense amplifier is activated, which produces a significant reduction in the speed of operation of the memory circuit.

It is therefore an object of the invention to provide a memory circuit capable of operation without the need for applying a reference voltage to one input of the output sense amplifier.

It is another object of the invention to provide a memory circuit that is operable at high speed.

A memory circuit according to the present invention comprises memory cells arranged in an array of $m$ rows and $n$ columns (where $m$ and $n$ denote integers larger than 1) and $n$ differential amplifiers. The memory array is divided into first and second row groups. Each of the differential amplifiers has a first input terminal connected to the memory cells belonging to the first row group and to one of $n$ columns, and a second input terminal connected to the other memory cells belonging to the second row group and to the same column as the column connected to the first terminal. The memory circuit further comprises an output sense amplifier having two input terminals and first and second selecting means. The first selecting means selects one of the differential amplifiers to electrically connect the first terminal of the selected differential amplifier to one input terminal of the output sense amplifier. The second selecting means selects one of the differential amplifiers to electrically connect the second terminal of the selected differential amplifier to the other input terminal of the output sense amplifier.

The memory circuit of the present invention can operate at a high speed, free of the prior art disadvantages.

Further objects, features and advantages of the invention will become more apparent from the following description taken in conjunction with the accompanying drawings, wherein.

Figure 2:
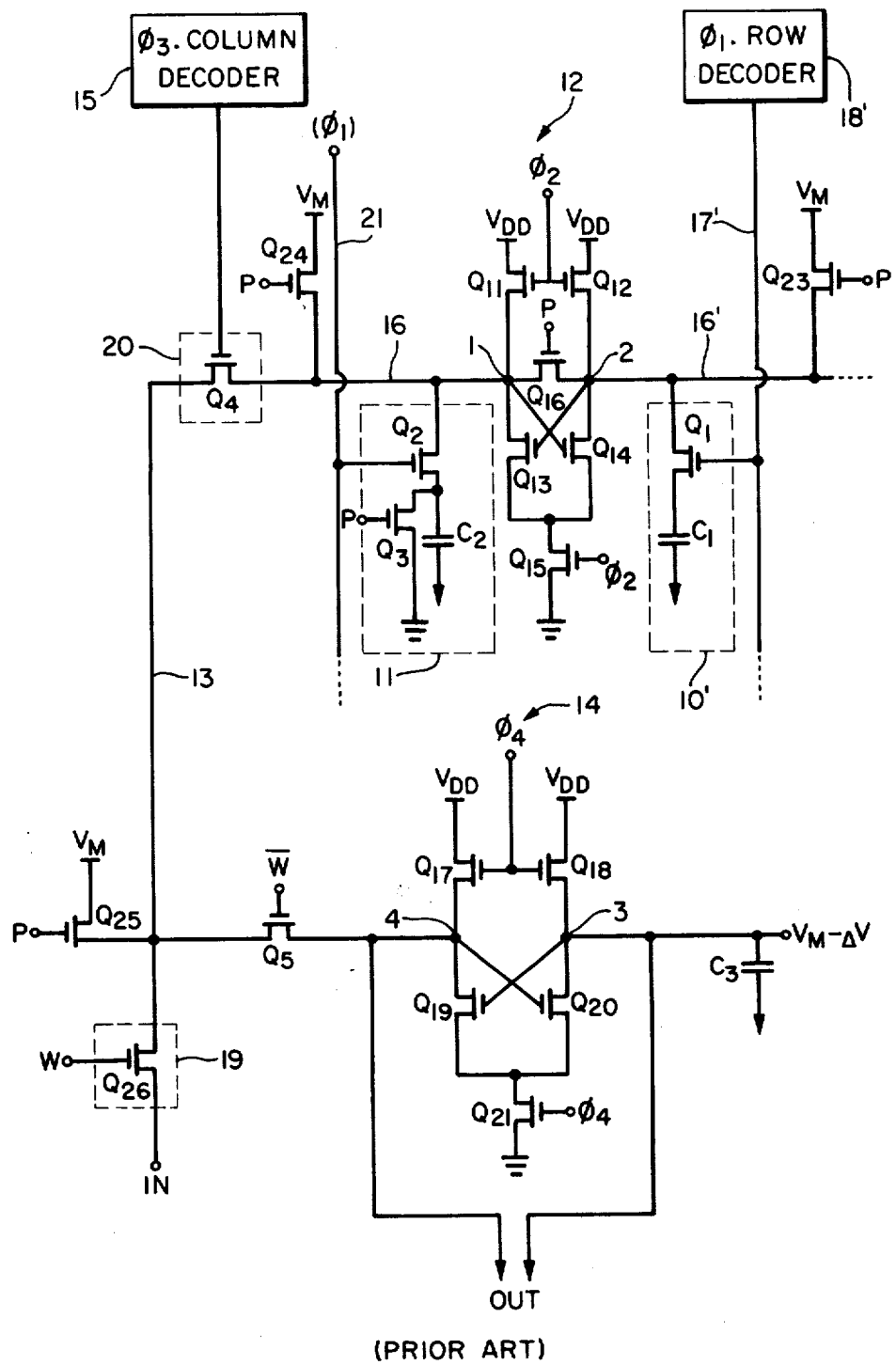
FIG. 2 is a circuit diagram of a part of the memory circuit shown in FIG. 1.
Figure 3A:
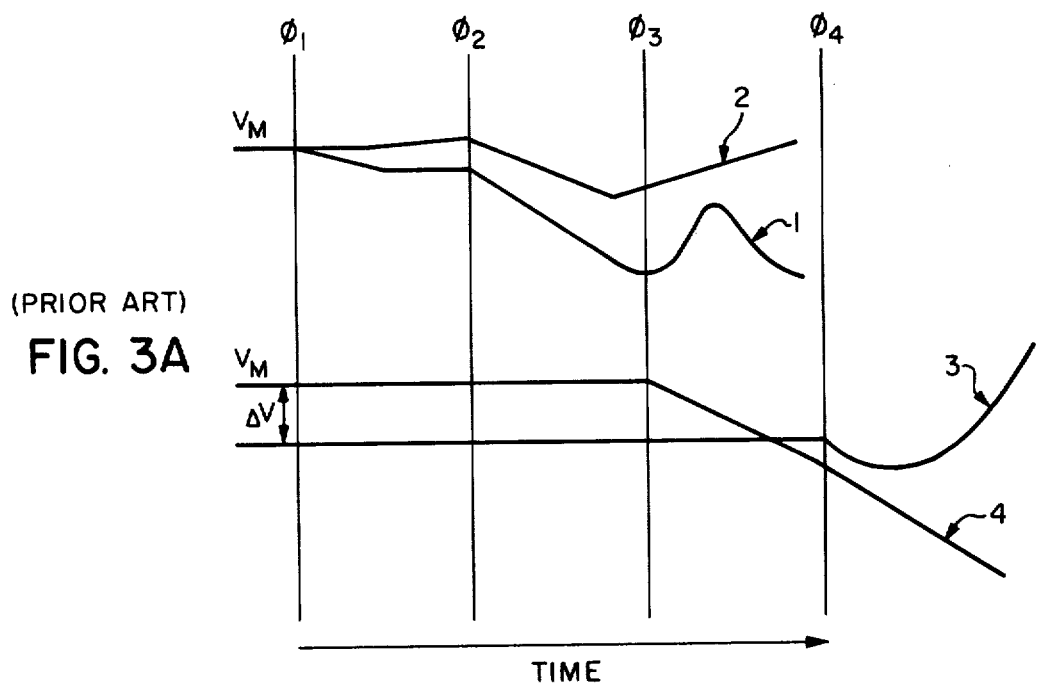
Figure 3B:
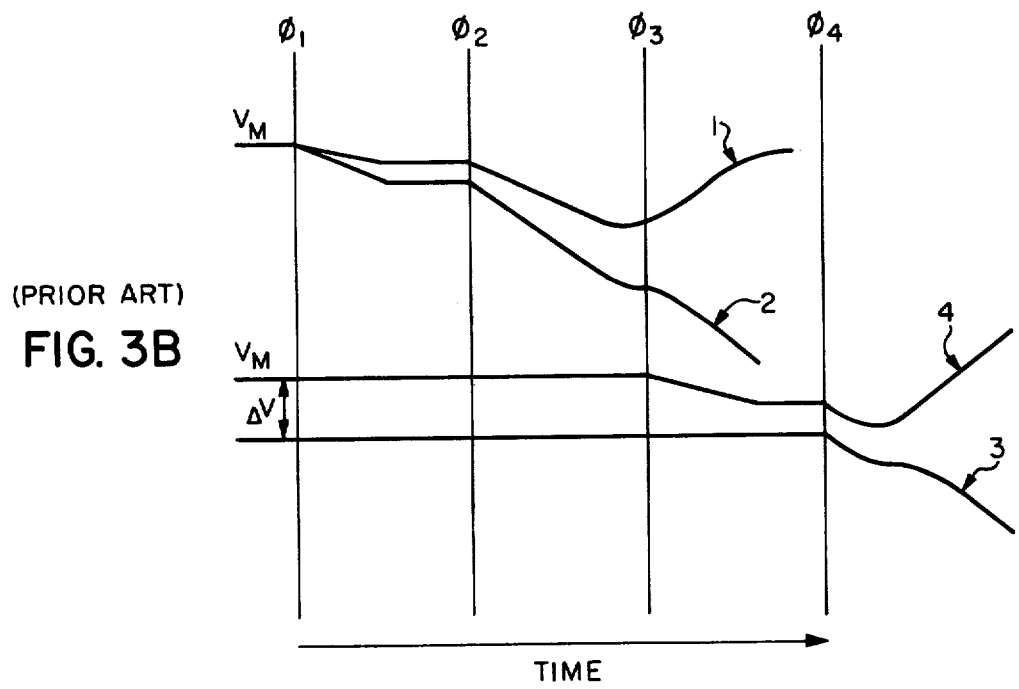
Figure 4:
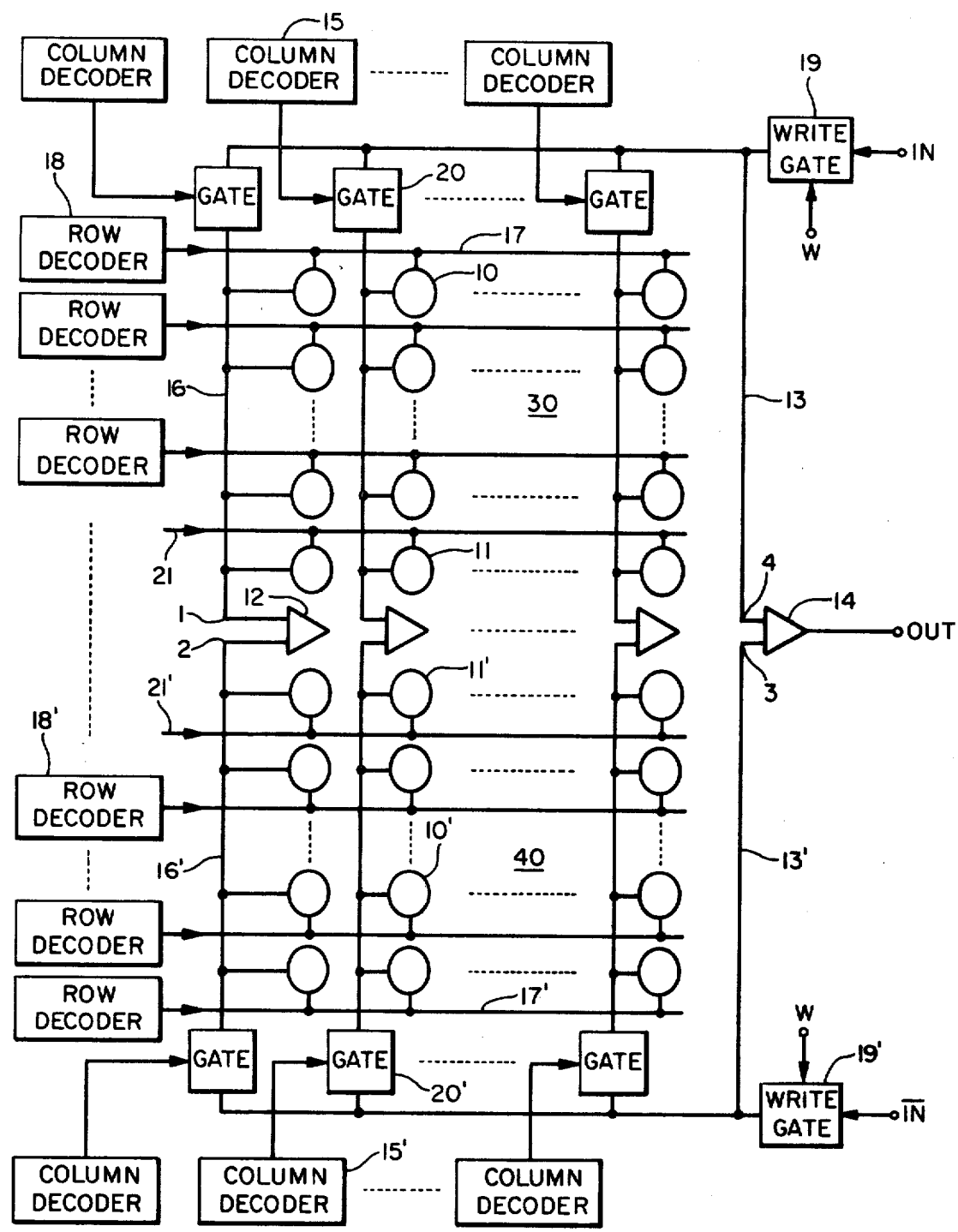
Figure 5:
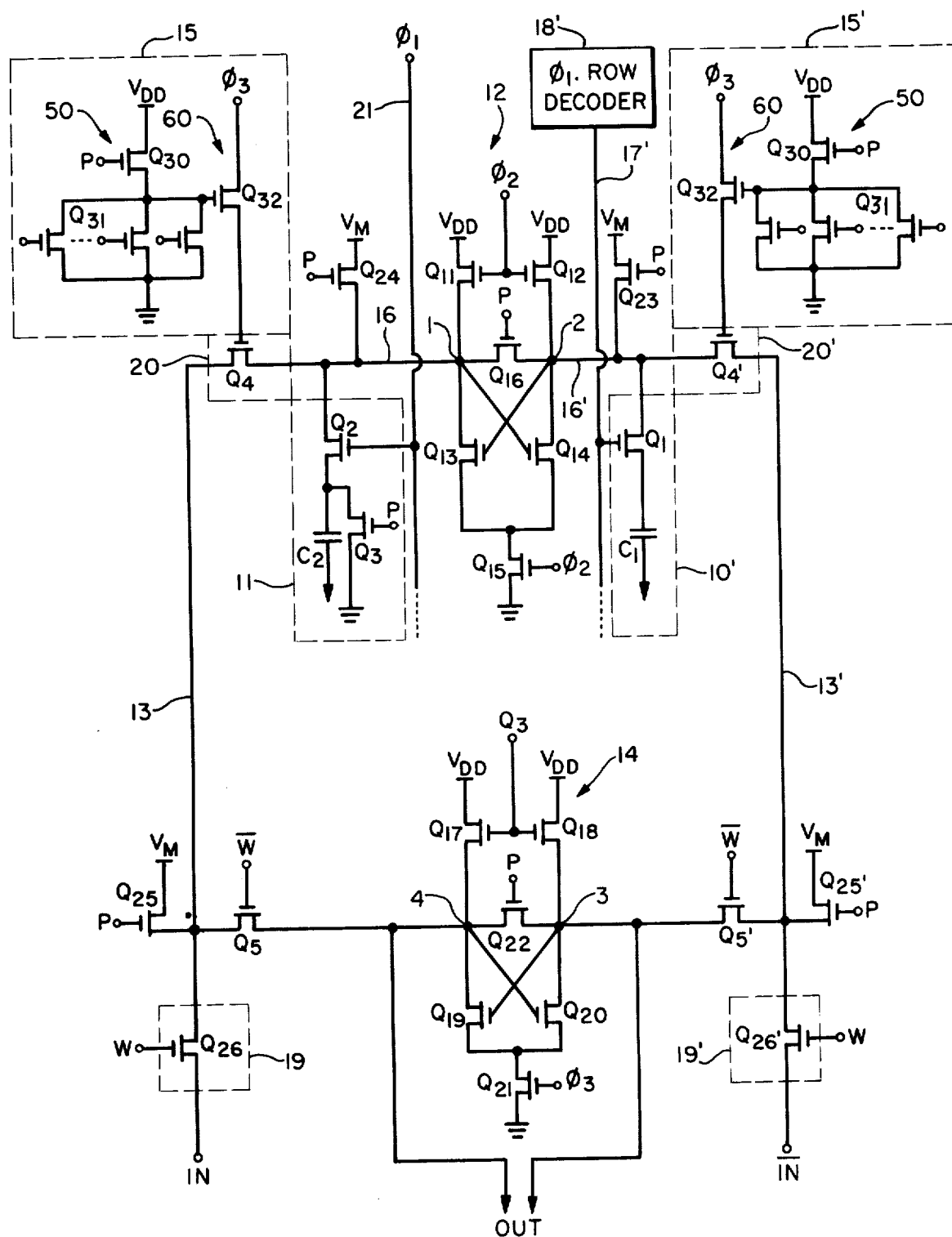

FIG. 3, consisting of 3A and 3B are waveform diagrams for explaining the operations of the circuit shown in FIG. 2, FIG. 4 is a block diagram of a memory circuit according to one embodiment of the invention, FIG. 5 is a circuit diagram of a part of the circuit of the invention, and FIG. 6 consisting of 6A and 6B waveform diagrams for explaining the operations of the circuit shown in FIG. 5.

Figure 1:
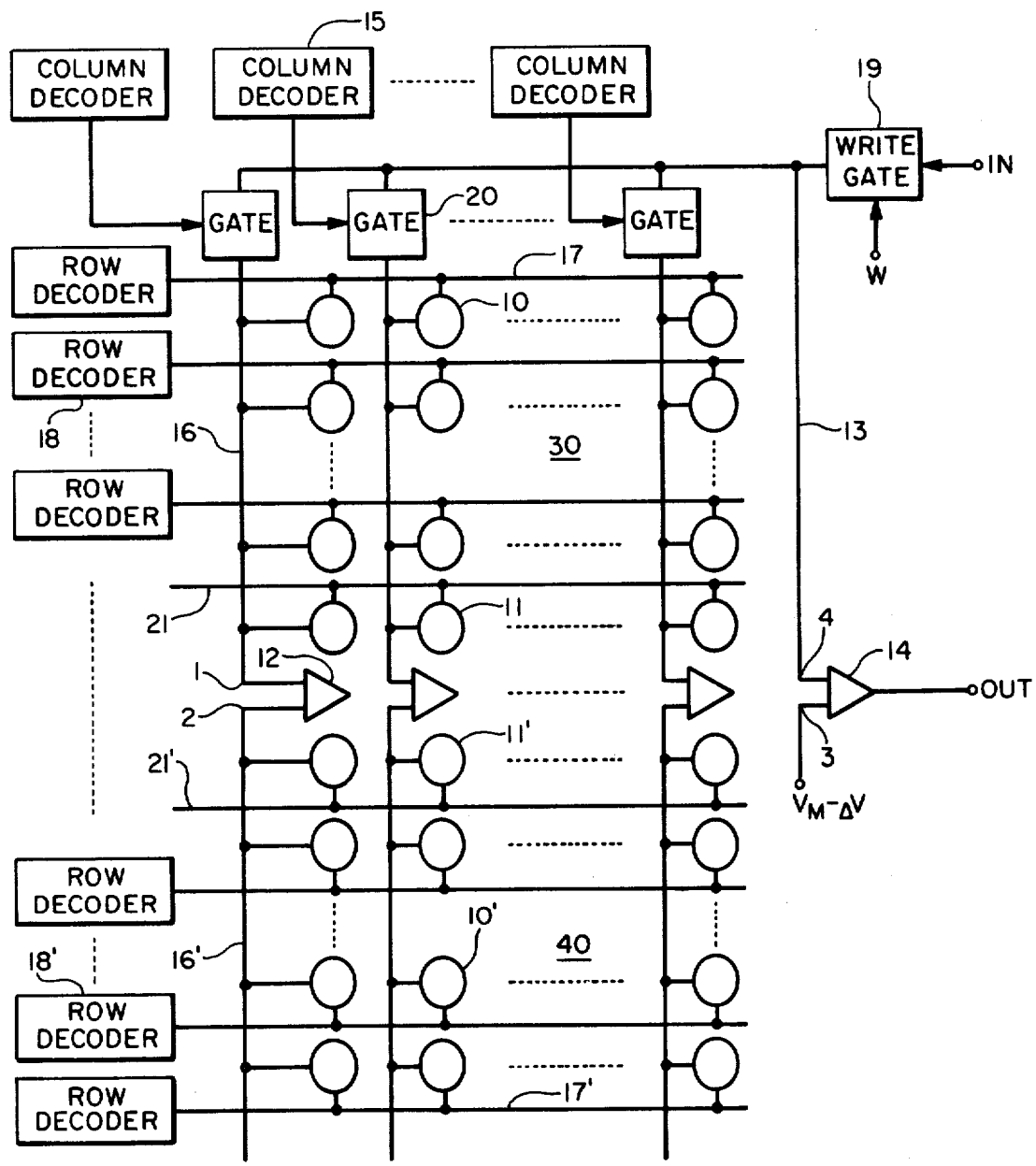
FIG. 1 is a block diagram of a conventional memory circuit.

With reference to FIG. 1, there is show in block form a prior art memory system comprising one-transistor-per-bit type memory cells arranged in a $64 \times 64$ bit array, that is, in a square array of 64 rows and 64 columns. The memory cell array is divided into first and second row groups 30, 40, each of which comprises 32 row lines, viz. word lines 17 and 17', respectively. There are provided 64 differential amplifiers 12 each having two inputs 1 and 2 that the supplied with signals from the column lines, viz. bit lines 16 and 16' which belong to the first and second row groups 30 an 40, respectively. Also provided are $64 \times 32$ numbers of one-transistor memory cells 10 at the intersections of bit lines 16 and word lines 17 in the first row group 30. Similarly, $64 \times 32$ numbers of memory cells 10' are provided at the intersections of bit lines 16' and word lines 17' in the second row group 40. To the word lines 17 in the first row group 30 respective row address decoders 18 are connected, and to the word lines 17' in the second row group 40 respective row address decoders 18' are also connected. Bit lines 16 are connected to an output/input bus (I/O) 13 through switching gate 20, respectively. The switching gates 20 are respectively switched to be on or off states by 64 numbers of column address decoders 15. An output sense amplifier 14 has one input 4 connected to the I/O bus 13 and another input 3 supplied with a reference voltage $(V_M - \Delta V)$. A write signal IN is applied to the I/O bus 13 through a write gate 19 opened by a write timing signal W. Moreover, there are 64 dummy cells 11 provided at the intersections of bit lines 16 and selecting lines 21 and 64 other dummy cells 11' provided at the intersections of bit lines 16' and selecting lines 21'. These dummy cells are used to generate the reference voltage for the differential amplifiers 12.

The information in one memory cell 10 selected by the column decoders 15 and the row decoders 18 emerges at one of the bit lines 16 to which the selected memory cell belongs. This bit line is connected to an I/O bus 13 through the switching gate 20 turned on by the decoder 15. As a result, the signal from the selected memory cell is supplied through the I/O bus 13 to one input 4 of the output differential amplifier 14 which operates as a sense amplifier. In this case, when one of the row lines 17 belonging to the first row group 30 is selected by the row decoder 18, the dummy cells 11' belonging to the second row group 40 are selected concurrently by a signal at the selecting line 21'. When one of the row lines 17' belonging to the second row group 40 is selected by the row decoder 18', the dummy cells 11 belonging to the first row group 30 are selected concurrently by a signal at the selecting line 21. As mentioned above, when one of the memory cells 10 belonging to the first row group 30 is selected, the potential at the selected bit line 16, which is applied to one input 1 of the amplifier 12, falls considerably if the information in the selected memory cell 10 is a low level, or falls slightly if it is a high level. At the same time, the potential at the bit lines 16', which is applied to the other input 2 of the amplifier 12, is lowered slightly below the initially set value by the dummy cell 11' belonging to the second row group 40. Then, simultaneously with energizing of the amplifier 12, the potential difference between the bit lines 16 and 16' is amplified by the amplifier 12. The resultant amplifier output is applied to the I/O bus 13 through the selected bit line 16 and the conductive gate 20 connected to this selected bit line 16, thence to one input 4 of the sense amplifier 14, in which the given input signal is compared with the reference voltage applied to the other input 3 thereof. The resultant difference voltage is amplified by the amplifier 14 and supplied to the output circuit (not shown).

Part of the memory circuit of FIG. 1 is shown in FIG. 2 in which like component elements are indicated by the identical references as in FIG. 1. Transistors used in this circuit are of N-channel MOS type, or briefly MOST. A memory cell 10' belonging to the second row group 40 is connected to the bit line 16' and to one input terminal 2 of the differential amplifier 12. The memory cell 10' is constituted of a MOST $Q_1$ and a capacitor $C_1$, the MOST $Q_1$ having its source connected through the capacitor $C_1$ to a certain specific potential, e.g., ground, its drain to the bit line 16', and its gate to the word line 17'. A dummy cell 11 belonging to the first row group 30 is connected to the bit line 16 and to the other input terminal 1 of the amplifier 12. The dummy cell 11 is constituted of MOST's $Q_2$ and $Q_3$ and a capacitor $C_2$. The MOST $Q_2$ has its source connected through the capacitor $C_2$ to a certain specific potential, e.g., ground, its drain to the bit line 16, and its gate is connected to the selecting line 21 supplied with a timing signal $\phi_1$. The MOST $Q_3$ has its gate supplied with a timing signal P, its source is connected to ground, and its drain is connected to the source of the MOST $Q_2$. The I/O bus 13 is connected to the bit line 16 through a MOST $Q_4$ constituting the switching gate 20 which is energized by an output of the column decoder 15 generated at the timing of a timing signal $\phi_3$. The I/O bus 13 is connected also to one input terminal 4 of the sense amplifier 14 through a MOST $Q_5$ which is energized by a signal $\overline{W}$ reverse in polarity to the write timing signal W. A reference voltage $V_M - \Delta V$ is applied to the other input 3 of the sense amplifier 14 by the capacitor $C_3$ connected to the node 3. The potential difference between the terminals 3 and 4 of the amplifier 14 represents the information stored in the memory cell 10', which is supplied to an external output circuit.

The amplifier 12 comprises switching MOST's $Q_{13}$ and $Q_{14}$ and load MOST's $Q_{11}$ and $Q_{12}$. The MOST's $Q_{13}$ and $Q_{14}$ have their gates respectively connected to the drain of the other and to nodes 2 and 1, and their sources are connected in common and grounded through a MOST $Q_{15}$. The MOST's $Q_{11}$, $Q_{12}$ and $Q_{15}$ receive at their gates a timing signal $\phi_2$ which energizes the amplifier 12 into operation. A MOST $Q_{16}$ is connected between the nodes 1 and 2 and has a gate supplied with the timing signal P. The nodes 1 and 2 are connected to power source $V_{DD}$ through MOST's $Q_{11}$ and $Q_{12}$, respectively.

The sense amplifier 14 comprises switching MOST's $Q_{19}$ and $Q_{20}$ and load MOST's $Q_{17}$ and $Q_{18}$. The MOST's $Q_{19}$ and $Q_{20}$ have gates respectively connected to the drains of the other and to nodes 3 and 4, and their sources are connected in common and grounded through a MOST $Q_{21}$. The MOST's $Q_{17}$, $Q_{18}$ and $Q_{21}$ receive at their gates a timing signal $\phi_4$ which energizes the amplifier 14. The power source $V_M$ is connected to the bit lines 16', 16 and the I/O bus 13 through MOST's $Q_{23}$, $Q_{24}$ and $Q_{25}$, respectively, whose gates are all supplied with the timing signal P. The timing signal P, in its initial value, stands at a high level. When the high level signal P is applied to the gates of the MOST's $Q_{16}$, $Q_{23}$, $Q_{24}$ and $Q_{25}$, these MOST's turn on, causing the nodes 1, 2 and 4 to be precharged to an initial value $V_M$, which level is set to be lower than a logical "1" level but higher than a logical "0" level of the information stored in the memory cell. Then, when the timing signal $\phi_1$ is in the high level, the information in the memory cell 10' selected by the row decoder 18' is read out to the bit line 16'. In other words, the charge in the capacitor $C_1$ of the memory cell 10' is transferred through MOST $Q_1$ to the parasitic capacitance at the node 2, causing the potential at the node 2 to be slightly changed. The signal in the dummy cell 11 selected by the same timing signal $\phi_1$ stands at the "0" level by the MOST $Q_3$ which is supplied with the timing signal P at its gate, causing the potential at the node 1 to be slightly lowered. The capacitance of the capacitor $C_2$ in the dummy cell 11 is determined so that the potential decrement at the node 1 due to the dummy cell 11 is smaller than that at the anode 2 due to the memory cell 10' when information in such memory cell 10' is at the "0" level.

The small potential difference developed between the nodes 1 and 2 is amplified by the amplifier 12 which is energized by the timing signal $\phi_2$. The amplified signal is applied to the I/O bus 13 through the MOST $Q_4$, which constitutes switching gate 20, at the timing of timing signal $\phi_3$. The signal level at the I/O bus 13 goes to the node 4 by way of the MOST $Q_5$ which turns on at read operation. The potential difference between the nodes 3 and 4 is amplified by the sense amplifier 14 which is energized by the timing signal $\phi_4$. The resultant amplifier output is supplied to the output circuit. The purpose of the MOST $Q_5$ is to isolate the amplifier 14 from the I/O bus 13 during a write operation.

FIG. 3 shows waveforms emerging at the nodes 1 and 2 and at the nodes 3 and 4 at timings of timing signals $\phi_1$ to $\phi_4$. The reference numerals 1 to 4 indicate potential variations at the nodes 1 to 4. Assume that the information in the memory cell 10' stands at the "1" level. Then, as shown in FIG. 3A, the potential at the node 2 rises slightly above the initial value $V_M$ after the timing signal $\phi_1$ due to the high level information in the memory cell 10', and the potential at the node 1 falls slightly below the initial value $V_M$ due to the information in the dummy cell 11. The potentials at the nodes 1 and 2 fall because these potentials are sufficient to turn on the MOST's $Q_{14}$ and $Q_{13}$ under the application of timing signal $\phi_2$. In practice, the potential is lower at the node 1 than at the node 2 under the application of timing signal $\phi_2$ and hence the transconductance gm of the MOST $Q_{14}$ is smaller than that of the MOST $Q_{13}$; that is, the potential falls faster at the node 1 than at the node 2, at a rate such that while the potential fall at the node 1 is approaching ground potential, the potential fall at the node 2 goes halfway. The bit line 16 selected by the column decoder 15 is connected to the I/O bus 13 by the timing signal $\phi_3$. The I/O bus 13 is set to the $V_M$ level by the timing signal P before the application of the timing signal $\phi_1$. Hence, upon the application of the timing signal $\phi_3$, the charge on the I/O bus 13 is transferred to the node 1, causing the potential at the node 1 to rise. However, the potential at the node 1 is still lower than that at the node 2, and hence the potential difference between the nodes 1 and 2 is amplified by the positive feedback function of the flip-flop type amplifier 12. Therefore, the potential on I/O bus falls to a low level. At the timing signal $\phi_3$, the potential at the node 4 falls due to the low level on the I/O bus 13. Accordingly, after the potential at the node 4 falls below the reference voltage $V_M - _\Delta V$ at the node 3 of the other input of the sense amplifier 14, the sense amplifier 14 must be activated by the timing signal $\phi_4$.

As shown in FIG. 3B, when the information in the memory cell 10' stands at the "0" level, the potential at the node 2 falls below that of the node 1 after the timing signal $\phi_1$. This is because the capacity of the capacitor $C_1$ comprised in the memory cell 10' is larger than that of the capacitor $C_2$ comprised in the dummy cell 11. At the timing signal $\phi_2$, therefore, the potential at the node 2 falls faster than that at the node 1. At the timing signal $\phi_3$ at which the bit line 16 is connected to the I/O bus 13, the higher potential at the node 1 further rises. The potential rise at the node 1 after the timing signal $\phi_3$ is ascribed to charge transfer from the I/O bus 13. Accordingly, the potential at the node 4 after the timing signal $\phi_3$ falls by a valve equal to the charge transferred therefrom. The lowered potential level at the node 4 must remain above the initial potential level $V_M - _\Delta V$ at the node 3.

As shown in FIG. 3, therefore, the initial level $(V_M - _\Delta V)$ at the node 3 should be sufficiently lower than the node 4 potential when the information in the memory cell 10' is at the "0" level. When the information in the memory cell 10' is at the "1" level, the initial level $(V_M - _\Delta V)$ at the node 3 should be high, or as near the potential $V_M$ as possible, as shown in FIG. 3A. Therefore, it is extremely difficult to determine the initial level at the node 3 by compromising this contradiction, and moreover, it is necessary that the occurrence of the timing signal $\phi_4$, which is to energize the amplifier 14, be sufficiently delayed behind the timing signal $\phi_3$.

Now referring again to FIG. 2, a write operation after a read operation (read-modify-write operation) will be considered. Assume that the potential at the node 2 is at a sufficiently low level after a read operation while the potential at the node 1 is at a sufficiently high level due to the MOST $Q_{11}$ and that a low level information is to be written from the terminal IN through the MOST $Q_{26}$. In this case, the potential at the node 1 is reduced to a low level, causing the MOST $Q_{14}$ to be non-conductive, and then the potential at the node 2 rises to a high level by the load MOST $Q_{12}$. Hence, unless the transconductance gm of the MOST $Q_{12}$ is large enough, the width of the write pulse W (i.e., the period for which the MOST $Q_{26}$ is on) is required to be long, causing the read-modify-write operation cycle to be long. If the transconductance gm of the MOST $Q_{12}$ is increased to reduce the write pulse width, the power consumption will be increased in the differential amplifier 12.

Assume that a high level information is written from the terminal IN when the potential at the node 1 is at a low level after a read operation. In this state, the MOST $Q_{13}$ is conductive. Therefore, unless the resistance of the bit line 16 is sufficiently small, a high potential cannot be established at the node 1.

With reference to FIG. 4, there is shown in block form a memory circuit in accordance with an embodiment of the invention. In FIG. 4, like component elements are indicated by the identical reference numerals as in FIG. 1. In this embodiment, a memory system comprises one-transistor-per-bit type memory cells arranged in a 64×64 bit array, that is, in a square array of 64 rows and 64 columns. The memory cell array is divided into first and second row groups 30, 40, similar to the prior art circuit shown in FIG. 1. In addition to the circuit shown in FIG. 1, there are 64 column decoders 15', 64 switching gates 20', an additional I/O bus 13', and an additional write gate 19' connected to the I/O bus 13', all of which are associated with the second row group 40. Bit lines 16' are connected to the I/O bus 13' through switching gates 20', respectively. The I/O bus 13' is connected to the other input 3 of the sense amplifier 14. The switching gates 20' are switched to be on and off states by the respective column decoders 15'. A write signal IN is applied to the I/O bus 13' through a write gate 19' opened by the write timing signal W. The write signal $\overline{\text{IN}}$ has a polarity opposite to the write signal IN applied to the write gate 19.

The information in the memory cell 10 belonging to the first row group 30 selected by the column decoder 15 and the row decoder 18 is read out to one of the bit lines 16 to which the selected memory cell belongs. At the same time, the dummy cells 11' belonging to the second row group 40 are selected by a signal at the selecting line 21. The potential at the bit line 16' belonging to the same column as the selected bit line 16 is varied by the dummy cells 11' as described above. Therefore, when the amplifier 12 is activated, the potential difference between the bit line 16 and 16' is amplified by the amplifier 12. Accordingly, one of the differential outputs on the selected bit line 16 is transferred to the input 4 of the sense amplifier 14 through the switching gate 20 opened by the column decoder 15. At the same time, the other differential output on the bit line 16' belonging to the same column as the bit line 16 is transferred to the input 3 of the sense amplifier 14 through the switching gate 20' opened by the additional column decoder 15'. In this circuit, therefore, the two inputs of the sense amplifier 14 make a difference signal, which dispenses with the use of the reference voltage $V_M - _\Delta V$ in the prior art circuit of FIG. 1.

FIG. 5 shows a part of the circuit shown in FIG. 4, in which like component elements are indicated by the identical references FIG. 2. The bit line 16' led to one input 2 of the amplifier 12 is connected to the I/O bus 13' through the switching gate 20' which is turned on by the output of the column decoder 15' presented at the timing of the timing signal $\phi_3$. The I/O bus 13' is connected to one input terminal 3 of the sense amplifier 14 through a MOST Q'$_5$ which is energized by a signal $\overline{W}$ reverse in polarity to the write timing signal W. The I/O bus 13' is further connected to the $\overline{\text{IN}}$ signal through the write gate 19'. The write gate 19' comprises the MOST Q'$_{26}$ having a gate supplied with the write timing signal W.

The column decoders 15 and 15' each consists of a NOR-type decoding circuit 50 and an address driver circuit 60. The NOR-type decoding circuit 50 comprises a common load MOST $Q_{30}$ having a gate supplied with the precharging signal P and six parallel decoding MOST's $Q_{31}$ each having a gate supplied with a true or complementary address signal. The source and drain of each MOST $Q_{31}$ are respectively connected to the ground and an output of the NOR decoding circuit 50. The output is connected to the power source $V_{DD}$ through the load MOST $Q_{30}$ and to a gate of the MOST $Q_{32}$ constituting the address driver 60. A drain of the MOST $Q_{32}$ is supplied with the timing signal $\phi_3$ and a source thereof is connected to the output of the decoder. The output of the decoder 15 is connected to the gate of the MOST $Q_4$ consitituting the switching gate 20. Similarly, the output of the decoder 15' is led to the gate of the MOST $Q'_4$ constituting the switching gate 20'. The output sense amplifier 14 comprises switching MOST's $Q_{19}$ and $Q_{20}$ having gates connected to the drains of the other respectively, drains connected to nodes 4 and 3, respectively, and sources connected in common and grounded through a MOST $Q_{21}$. The nodes 3 and 4 are connected through load MOST's $Q_{18}$ and $Q_{17}$ to the power source $V_{DD}$, respectively. The MOST's $Q_{17}$, $Q_{18}$ and $Q_{21}$ receive at their gates a timing signal $\phi_3$. The MOST $Q_{22}$ having a gate supplied with the prechanging signal P is connected between the nodes 3 and 4. The power source $V_M$ is connected to the bit lines 16' and 16, and I/O buses 13 and 13' through MOST's $Q_{23}$, $Q_{24}$, $Q_{25}$, and $Q'_{25}$, respectively, whose gates are supplied with the precharging timing signal P. The other circuit arrangements, that is, the differential amplifiers 12, the memory cells 10 and 10', the dummy cells 11 and 11', the word lines 17 and 17', and the row decoders 18 and 18' are similar to those in the circuit of FIG. 3.

Figure 6A:
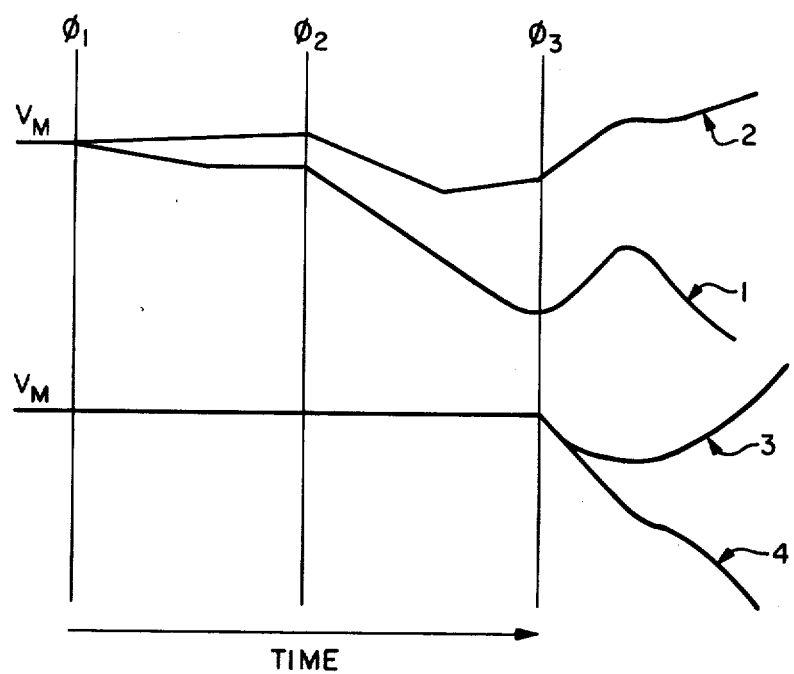

FIG. 6 shows timing waveforms for illustrating the operation of the circuit of FIG. 5. In this figure, the reference numerals 1 to 4 indicate potential varriations at the nodes 1 to 4, respectively. Before the application of the timing signal $\phi_1$, the potentials at the nodes 1 to 4 are precharged to the $V_M$ level by the MOST's $Q_{24}$, $Q_{23}$, $Q_{25}$, and $Q'_{25}$ turned on by the precharging signal P. By the timing of the timing signal $\phi_1$, the memory cell 10' belonging to the second row group 40 is selected by the row decoder 18'. Assume that the information in the memory cell 10' stands at the "1" level. Then, as shown in FIG. 6A, the potential at node 2 rises slightly above the initial value $V_M$ due to the high level information of the memory cell 10', and the potential at the mode 1 falls slightly below the initial value $V_M$ due to the information in the dummy cell 11 belonging to the first row group 30 as described in the circuit of FIG. 2. The potentials at the nodes 1 and 2 fall because these potentials are sufficient to turn on the MOST's $Q_{14}$ and $Q_{13}$ under the application of the timing signal $\phi_2$. In this state, the potential is lower at the node 1 than at the node 2, and hence the transconductance gm of the MOST $Q_{14}$ is smaller than that of the MOST $Q_{13}$. Therefore, the potential falls faster at the node 1 than at the node 2. As the result, the potential at the node 1 falls near to the ground potential and that at the node 2 decreases no longer. The bit line 16 selected by the column decoder 15 is connected to the I/O bus 13 by the timing signal $\phi_3$. At the same time, the bit line 16', belonging to the same column as the bit line 16, selected by the additional column decoder 15', is connected to the additional I/O bus 13'. The I/O buses 3 and 13' are set to the $V_M$ level by the timing signal P before the application of the timing signal $\phi_1$. Therefore, upon the application of the timing signal $\phi_3$, the charge on the I/O buses 13 and 13' are transferred to the nodes 1 and 2, respectively, causing the potential at the nodes 1 and 2 to slightly rise. However, the potential at the node 1 is still lower than that at the node 2, and hence the potential difference between the nodes 1 and 2 is more amplified by the positive feedback function of the flip-flop type amplifier 12. Therefore, the low and high level information appear on the I/O bus line 13 and 13', respectively. One input 3 of the sense amplifier 14 is connected to the I/O bus 13' through the MOST $Q_5'$ which turns on at read operation, and the other input 4 thereof is connected to the I/O bus 13. As the result, two inputs 3, 4 of the sense amplifier 14 are high and low at the application of the timing signal $\phi_3$ by which the sense amplifier 14 is energized. Accordingly, the amplifier 14 immediately amplifies the differential potential between the input nodes 3 and 4 at the same time of the timing signal $\phi_3$.

Figure 6B:
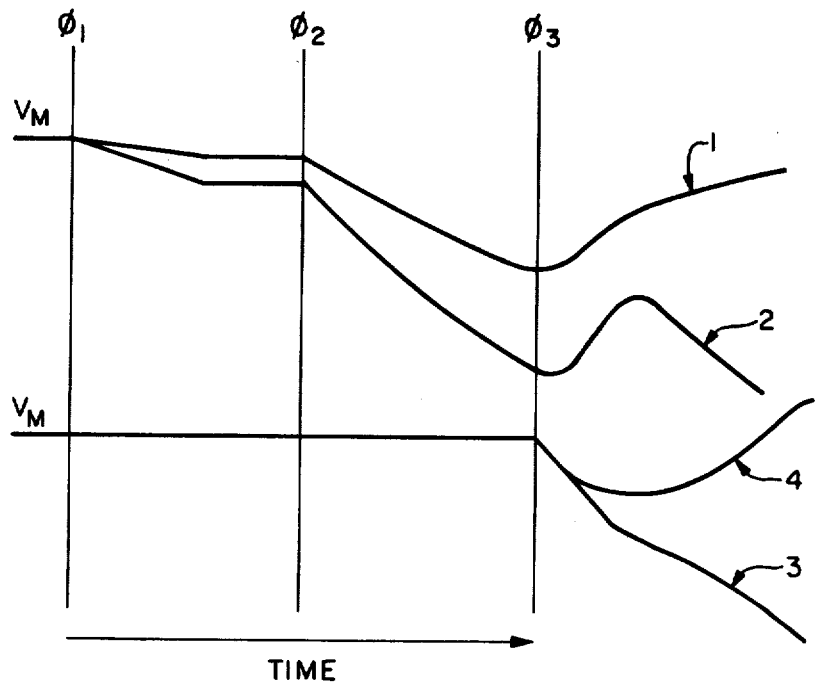

As shown in FIG. 6B, when the information in the selected memory cell 10' stands at the "0" level, the potential at the node 2 falls below that of the node 1 after the timing signal $\phi_1$, as described above. By the application of the timing signal $\phi_2$ the amplifier 12 is activated to amplify the difference potential between the nodes 1 and 2 such as the potential at the node 1 is higher than that at the node 2. Therefore, at the application of timing signal $\phi_3$, the high level signal on the bit line 16 connected to the node 1 is transferred to the I/O bus 13 through the switching gate 20 opened by the decoder 15. On the other hand, the low level signal on the bit line 16', which belongs to the same column as the bit line 16, connected to the node 2 is transferred to the I/O bus 13' through the gate 20' opened by the decoder 15'. At the same time, the high and low level signals on the I/O buses 13 and 13' are respectively applied to the inputs 4 and 3 of the sense amplifier 14 activated by the timing signal $\phi_3$. Accordingly, the different potential between the input nodes 3 and 4 is amplified by the amplifier 14 at the application of the timing signal $\phi_3$.

Thus, the timing for energizing the sense amplifier 14 can be caused to occur concurrently with the timing signal $\phi_3$, and hence the memory circuit can operate at a higher speed than the prior circuit of FIG. 1.

Moreover, since the differential potential is surely applied to the inputs nodes 3 and 4 of the sense amplifier 14, the reference voltage $V_M - \Delta V$ applied to the input nodes as in the prior circuit is eliminated in the circuit of the present invention. Writing of new data into a memory cell is done with a complementary signals IN AND $\overline{IN}$ through the MOST's $Q_{26}$ and $Q_{26}'$, respectively. In FIG. 5, assume that the potential at the node 2 is at a sufficiently low level after a read operation, and the potential at the node 1 is at a sufficiently high level. To write a high level information in the memory cell 10', the low and high level signal are applied to terminals IN and $\overline{IN}$ through the write gates 19 and 19' opened by the write timing signal W, respectively. Therefore, the potentials at the nodes 1 and 2 are varied by the signals IN and $\overline{IN}$ and become low and high levels, respectively. Accordingly, it is not necessary that the load MOST's $Q_{11}$ and $Q_{12}$ have a large transconductance gm, and hence the power consumption is smaller in the amplifiers 12 than that of the prior circuit of FIG. 1. Moreover, the period of the write operation is shorter than that of the prior circuit.

What is claimed is:

1. A memory circuit comprising a plurality of memory cells arranged in an array of rows and columns, said memory cells each consisting of a single field effect transistor and a storage capacitor, said memory array being divided into first and second row groups; a plurality of cross-coupled differential amplifiers having first input terminals respectively connected to the memory cells belonging to said first row group and each column, and second input terminals respectively connected to the memory cells belonging to said second row group and each same column as that connected to said first terminal; and output sense amplifier having first and second input terminals; first means for operatively connecting the first terminal of a selected one of said differential amplifiers to said first terminal of said sense amplifier, and second means for operatively connecting the second terminal of said selected differential amplifier to said second terminal of said sense amplifier.

2. The memory circuit of claim 1, in which said first and second connecting means respectively include first and second switching means respectively operatively interposed between said memory cells belonging to said first and second groups in each column and said first and second terminals of said sense amplifier, and first and second addressing means for respectively activating a selected one of said first and second switching means.

3. The memory circuit of claim 2, in which said addressing means includes a first group of column decoders operatively connected to said first switching means, and a group of additional column decoders operatively connected to said second switching means.

4. The memory circuit of claim 1, in which said first connecting means includes first column selecting means for selecting said selected one of said differential amplifiers and said second connecting means includes additional column selecting means.

5. The memory circuit of claim 4, further comprising a plurality of first switch means respectively operatively connected between said first input terminals of said differential amplifiers and said first terminal of said sense amplifier, and a plurality of second switch means operatively connected between said second input terminals of said differential amplifiers and said second terminal of said sense amplifier, said first and second plurality of switch means being operatively selectively actuated by said first and said additional column selecting means.

6. A memory circuit comprising a plurality of memory cells arranged in an array of rows and columns, said array being divided into first and second row groups; a plurality of differential amplifiers having first input terminals respectively connected to the memory cells belonging to said first row group and each of said columns, and second input terminals respectively connected to the memory cells belonging to said second row group and each same column as that connected to said first input terminals; first and second input-output bus lines; first means for operatively connecting the first terminal of the selected differential amplifier to said first input-output bus line; second means for operatively connecting the second terminal of said selected differential amplifier to said second input-output bus line; and means for simultaneously supplying said first input-output bus line with one of the logic "1" and "0" signals and said second input-output bus line with the other of said logic "1" and "0" signals when said memory circuit is enabled in the write-operation mode.

7. The memory circuit of claim 6, further comprising an output sense amplifier having first and second input terminals, said first and second input terminals being connected to said first and second bus lines, respectively.

8. The memory circuit of claim 6, in which said supplying means includes first and second gates coupled to said first and second input-output bus lines, respectively, and means for transferring the true and complementary of input signals to said first and second bus lines, respectively, in response to a write command signal.

* * * * *